United States Patent [19]
Opris et al.

[11] Patent Number: 5,541,602
[45] Date of Patent: Jul. 30, 1996

[54] MULTI-PHASED PIPELAND ANALOG TO DIGITAL CONVERTER

[75] Inventors: Ion E. Opris, Stanford; Laurence D. Lewicki, Sunnyvale, both of Calif.

[73] Assignee: National Semiconductor Corporation, Santa Clara, Calif.

[21] Appl. No.: 451,682

[22] Filed: May 26, 1995

[51] Int. Cl.$^6$ ................................................. H03M 1/38
[52] U.S. Cl. ........................................... 341/161; 341/155
[58] Field of Search ..................................... 341/161, 156, 341/162, 120, 118, 155

[56] References Cited

U.S. PATENT DOCUMENTS

| | | | |
|---|---|---|---|
| 5,027,116 | 6/1991 | Armstrong et al. | 341/120 |
| 5,043,732 | 8/1991 | Robertson et al. | 341/156 |

OTHER PUBLICATIONS

B. Yeshwant Kamath, Robert G. Meyer, Paul R. Gray, Relationship Between Frequency Response and Settling Time of Operational Amplifiers, IEEE Journal of Solid-State Circuits, vol. SC-9.

Deog-Kyoon Jeong, Gaetano Borriello, David A. Hodges,, Design of PLL-Based Clock Generation Circuits, IEEE Journal of Solid-State Circuits, vol. SC-22, Apr. 1987, pp. 255-261.

Primary Examiner—Brian K. Young
Attorney, Agent, or Firm—Limbach & Limbach L.L.P.; Slade E. Smith

[57] ABSTRACT

An analog to digital converter stage that has a very short sampling phase settling time requirement is used in a multistage pipelined analog to digital converter with a novel clocking design. Each clock period has a sampling phase and a hold phase. According to a first aspect, the sampling phase of each clock cycle is much shorter than the hold phase. This takes advantage of the reduced sampling phase settling time requirement of the analog to digital converter stage according to the present invention, and also allows a relatively longer hold phase during each clock cycle. The analog to digital converter stage according to the present invention is implemented with an operational amplifier such that during the sampling phase, the operational amplifier does not have to settle in order for correct sampling to occur, whereas operational amplifier settling is required during the hold phase. According to a second aspect, several clocks are cyclicly recirculated among the stages of a pipelined analog to digital converter.

23 Claims, 9 Drawing Sheets

MULTI-PHASED PIPELAND ANALOG TO DIGITAL CONVERTER

BACKGROUND OF THE INVENTION

1. Field of the Invention

The present invention relates to the field of analog to digital conversion. Specifically, the present invention relates to pipelined multistage analog to digital converters.

2. Discussion of the Related Art

For high conversion speeds several techniques are currently used, such as flash, multi-step, pipeline, interpolating, and time-interleaved successive approximation. Out of these, the pipelined techniques offer the best trade-off between complexity, silicon area, and power consumption on the one hand and conversion speed on the other hand.

Figure 1:
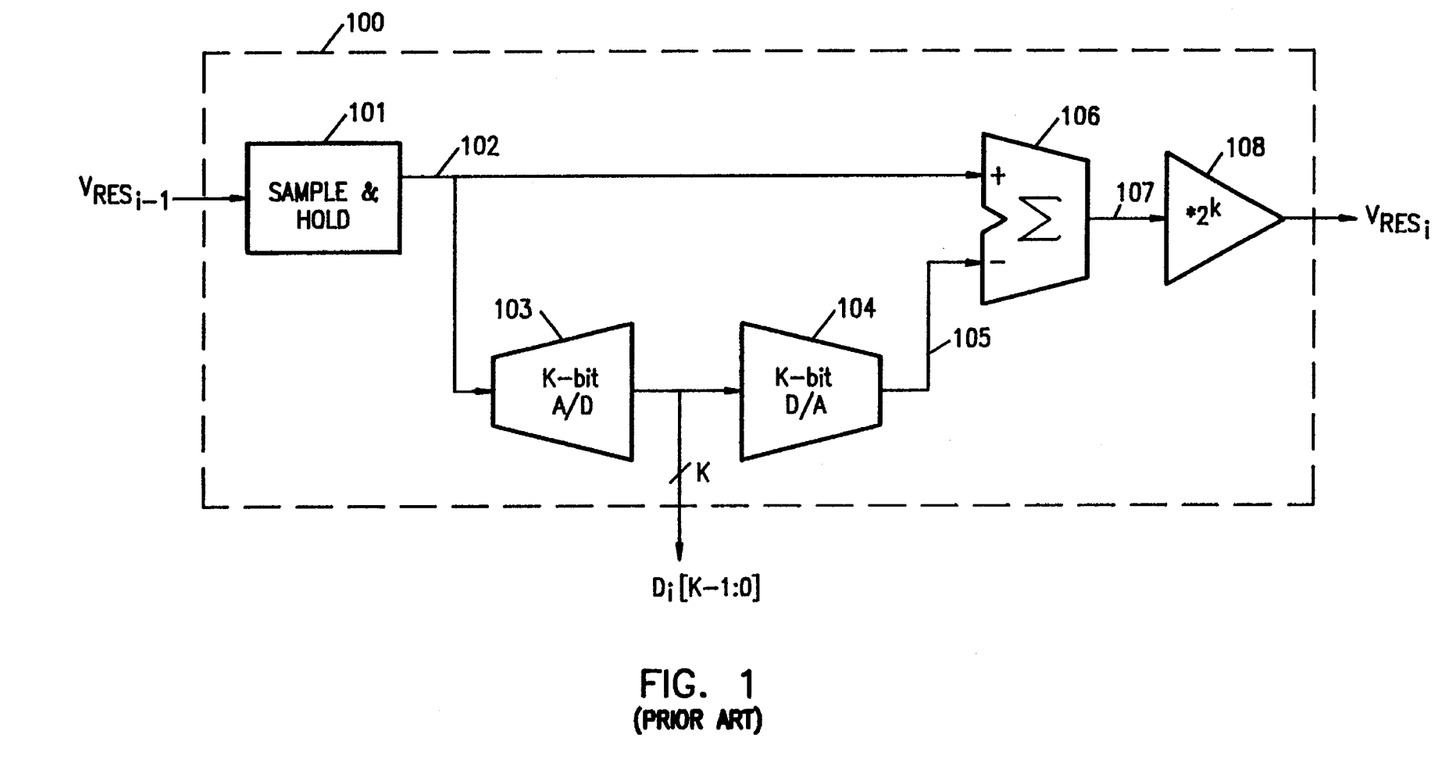
FIG. 1 illustrates a conventional pipeline stage for a multistage analog to digital converter that produces K digital output bits.

A typical K-bit pipelined converter stage has the block diagram of FIG. 1. The analog input to stage I 100 is the residue $Vres_{i-1}$ from the preceding stage i–1. The analog input $Vres_{i-1}$ is sampled and held by a sample and hold circuit 101. The sample and hold circuit 101 latches the potentially time varying analog input level $Vres_{i-1}$ and maintains its sampled analog output 102 at a constant analog level for a certain hold time $t_{hold}$. The sampled analog output 102 is converted into a K-bit digital code $D_i[K-1:0]$ by the analog to digital subconverter 103. This K-bit digital code $D_i[K-1:0]$ is output by stage i 100 and represents K raw digital output bits of the overall pipelined converter (not shown). Less significant output bits are generated by subsequent stages of the pipelined analog to digital converter. In order to generate less significant output bits, the latched analog input level 102 must be reduced by an analog amount which exactly corresponds to the K-bit digital code $D_i[K-1:0]$ extracted by the analog to digital subconverter 103. Therefore, a local K-bit digital to analog converter 104 is used to generate an analog voltage 105 which corresponds to the K-bit digital code $D_i[K-1:0]$. This analog voltage 105 is subtracted from the latched analog input 102 by an analog subtractor 106. The analog residue 107 output by the analog subtractor 106 is analogous to a remainder in division-after each group of K output digits is produced, the remainder 107 is passed on to the next iteration. In order to allow each stage to be identical, the residue 107 is amplified by the radix of the stage by amplifier 108 to produce the output residue $Vres_i$ of stage i. For a K-bit binary converter stage, the appropriate amplification factor is $2^K$.

The resulting residue $Vres_i$ can be calculated from the following equation 1.

$$Vres_i = 2^K(Vres_{i-1} - Vdac_i) \quad (1)$$

The linearity of the pipelined analog to digital converter is dependent upon the linearity of the first stage that produces the most significant digital output bits. Therefore, single bit analog to digital subconverters and digital to analog converters are very popular because of their inherent linearity. Single bit digital to analog converters are inherently linear because there is always a straight line that can be drawn between the two output voltages, which are typically a reference voltage and ground. Single bit analog to digital converters are essentially comparators. If the input voltage to the single bit analog to digital converter is greater than a threshold value, the digital output is one; in contrast, if the input voltage is less than the threshold value, the digital output is zero. By placing the threshold exactly in the center of the input voltage range, a single bit analog to digital converter (comparator) can be made perfectly linear. If K=1, the analog to digital subconverter 103 is a comparator, and the local digital to analog converter 104 has only two output values. The digital output extracted from the ith stage degenerates to a single bit $D_i$. In this case, the ideal gain of the converter stage is 2, and the equation for the residue is given by the following equation.

$$Vres_i = 2Vres_{i-1} - D_i Vref \quad (2)$$

In equation 2, both the input residue $Vres_{i-1}$ and the output residue $Vres_i$ exist within the range from 0 to +Vref, and the digital data $D_i$ can take only the values 0 or 1.

Figure 2A:
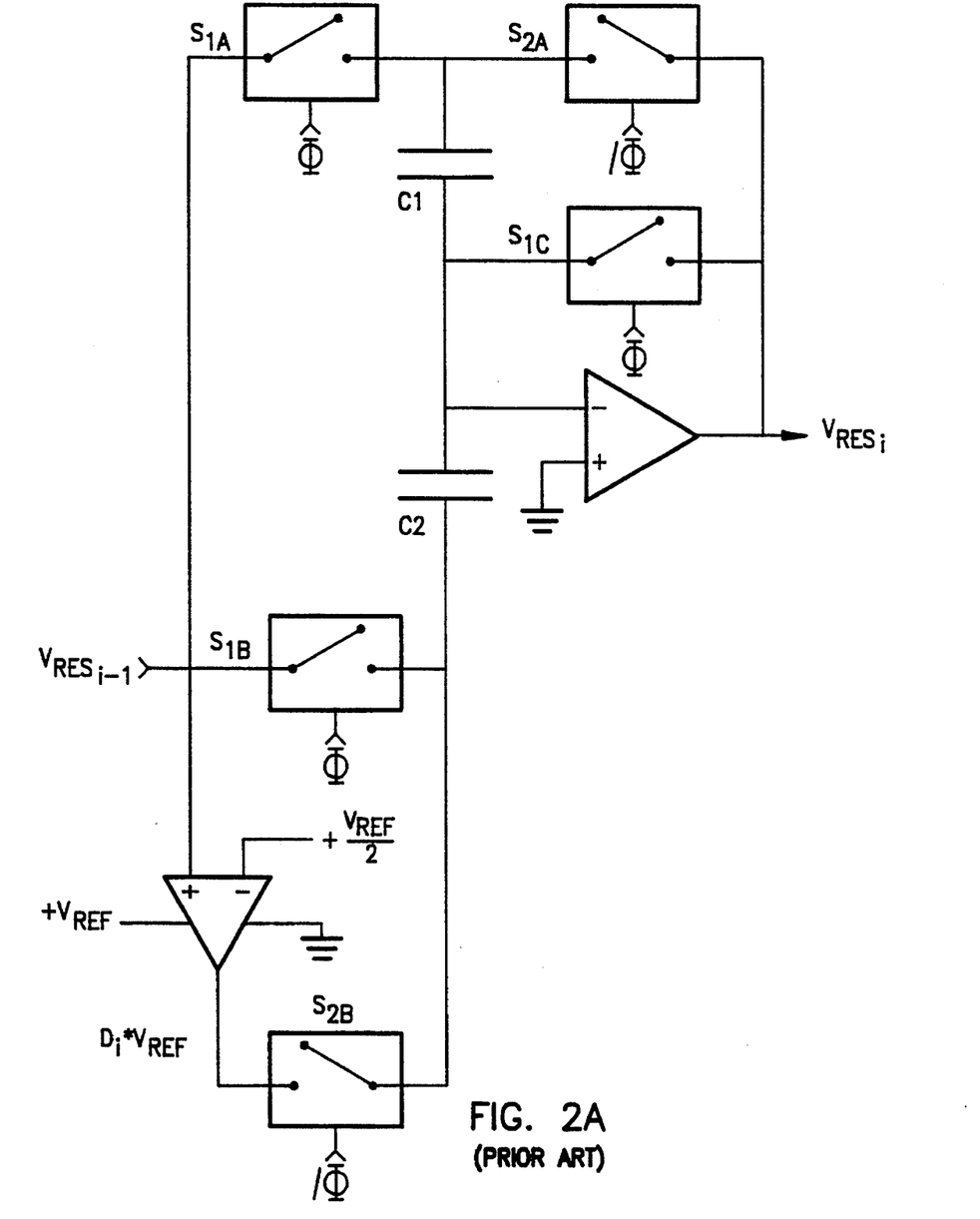
FIG. 2A illustrates a conventional circuit implementation of the conventional stage shown in FIG. 1 that produces one bit and typically runs on a two-phase 50% sampling clock.

The circuit shown in FIG. 2A is typically used to generate the output residue $Vres_i$ when the converter pipeline is designed to pass a single-ended, rather than differential, residue from stage to stage. The circuit shown in FIG. 2A operates using a two-phase non-overlapping clock. During phase 1, switches S1A, S1B, and S1C are closed while switches S2A and S2B are open. During phase 2, switches S2A and S2B are closed while switches S1A, S1B, and S1C are open.

Figure 2B:
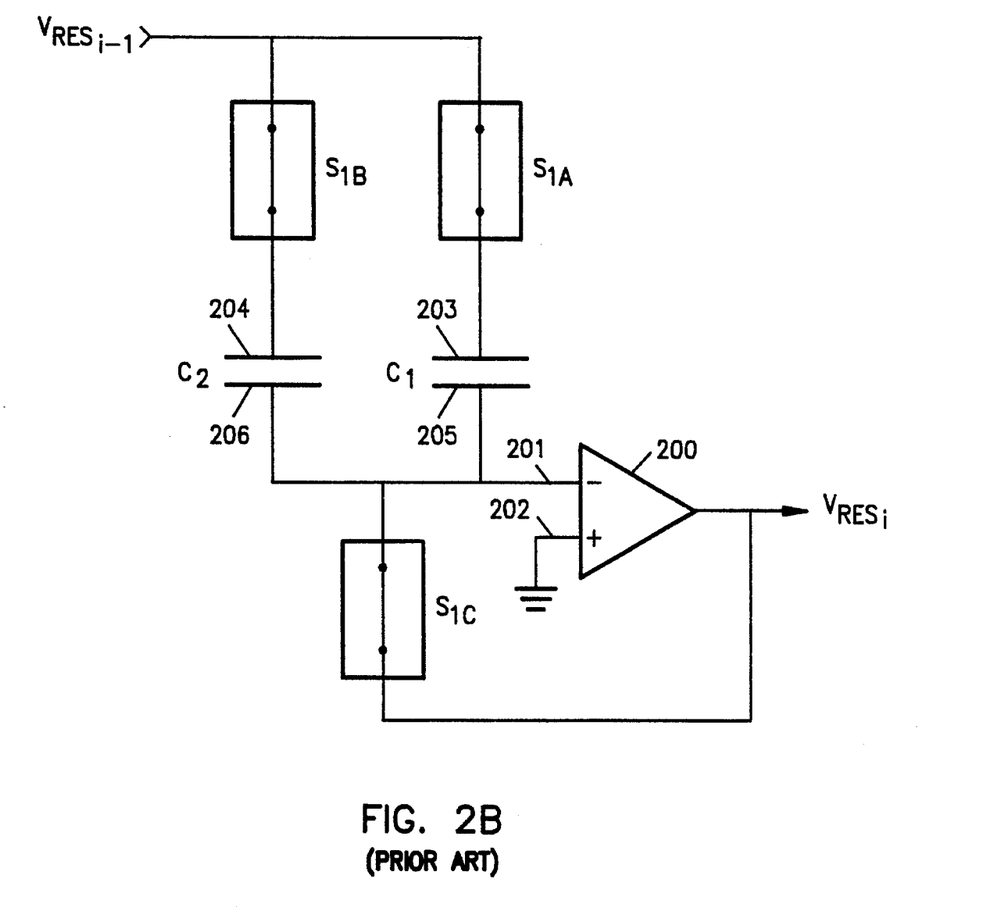
FIG. 2B illustrates the subcircuit created during the sampling clock phase of the conventional circuit shown in FIG. 2A.

FIG. 2B illustrates the configuration of the circuit of FIG. 2A during phase 1 of the non-overlapping clocks. During phase 1, the switch S1C holds the operational amplifier 200 in a voltage follower configuration. When an ideal operational amplifier is operated in its linear region, the voltages at the plus input 202 and at the minus input 201 are always essentially equal to each other, because the gain of the operational amplifier is very large, usually on the order of 100,000 or more. An ideal operational amplifier therefore has an input-output characteristic determined by the following equation.

$$A*(Vin+ - Vin-) = Vout \quad (3)$$

Unfortunately, however, most real operational amplifiers are not ideal. Most real operational amplifiers have a non-zero offset. When both inputs are grounded, the output is not zero, but is some offset voltage Voffset. The effect of offset is that the input-output characteristic becomes the following.

$$A*(Vin+ - Vin-) = Vout + Voffset \quad (4)$$

Therefore, in this voltage follower configuration shown in FIG. 2A, the minus input 201 to the operational amplifier 200 settles to a level essentially equal to the operational amplifier offset voltage Voffset divided by the gain A. Since the gain A is very large, the voltage Vin– at the operational amplifier minus input 201 and at the output $Vres_i$ are approximately zero, and the effect of the offset voltage Voffset on the output of the operational amplifier 200 is essentially negated with almost no effect on the voltages of the capacitors C1 and C2. Thus, during the sampling phase, the following relations hold.

$$Vin+ = 0 \quad (5A)$$

$$Vin- = Vres_i = 0 \quad (5B)$$

As a consequence, during the sampling phase 1, the input voltage $Vres_{i-1}$ is sampled through switches S1A and S1B across the positive terminals 203 and 204 of capacitors C1 and C2, respectively, while approximately zero is applied to the negative terminals 20B and 206 of the capacitors C1 and C2. The total voltage across capacitors C1 and C2 thus becomes the following.

$$VC1=VC2=Vres_{i-1} \quad (6)$$

Figure 2C:
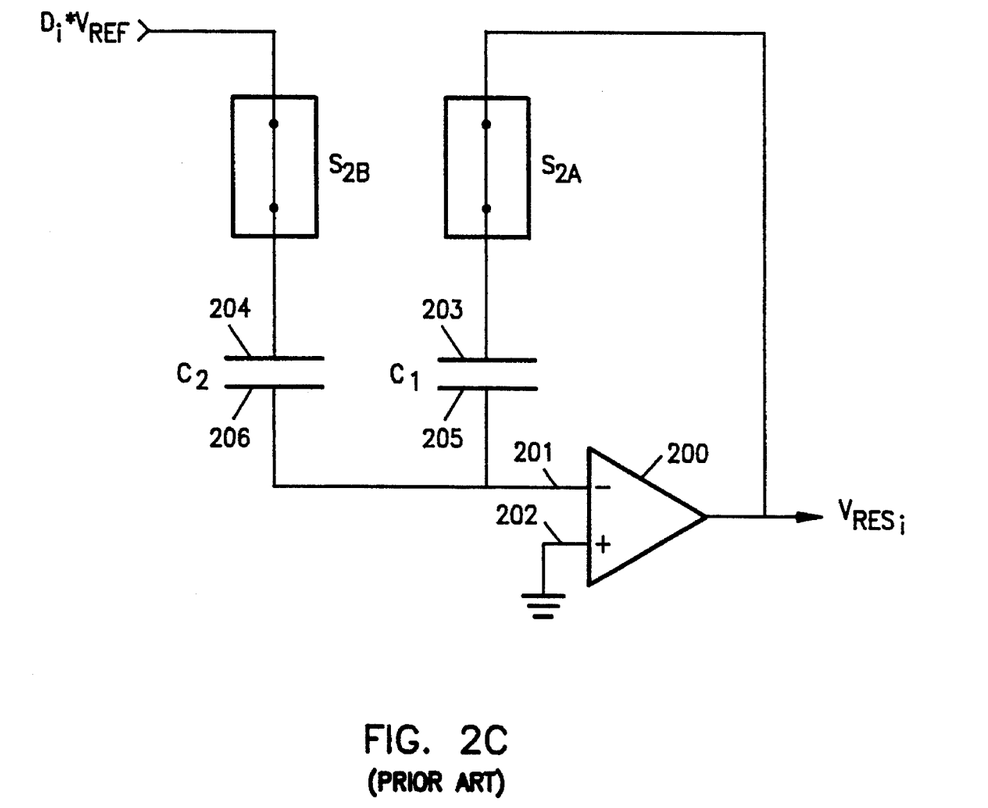
FIG. 2C illustrates the subcircuit created during the hold clock phase of the conventional circuit shown in FIG. 2A.

As shown in FIG. 2C, During the output phase 2 of the non-overlapping clocks, capacitor C1 is connected to the operational amplifier output $Vres_i$ through the switch S2A, and capacitor C2 is connected to $D_i Vref$ through the switch S2B.

An attractive feature of this circuit is that the offset voltage of the operational amplifier 200 is effectively canceled. During the hold phase 2, switch S2B connects $D_i Vref$ to the positive terminal of capacitor C2, and switch S2A connects the output $Vres_i$ to the positive terminal of capacitor C1. Let the voltages over time t across capacitors C1 and C2 be VC1(t) and VC2(t), respectively. If the switches S2A and S2B are closed at time t=0, then the following relations hold just at the time t=0– just prior to the switches S2A and S2B being closed.

$$VC1(0-)=VC2(0-)=Vres_{i-1} \quad (7)$$

After the switches are closed at time t=0 and remain closed for a sufficient time, the following relations hold because the minus input Vin– 201 is always essentially at ground.

$$VC2(\infty)=D_i Vref \quad (8)$$

The positive and negative terminals of an operational amplifier are designed to draw no current. Because the minus input 201 draws negligible current, the current i2 through capacitor C2 is the negative of the current i1 through capacitor C1. Because the capacitances of C1 and C2 are designed to be identical, any decrease in voltage across capacitor C2 causes a corresponding increase in the voltage across capacitor C1, and vice versa. Therefore, after a long time (at t=∞), the voltage across capacitor C1 is its initial value minus the change in voltage across capacitor C2. Therefore, the following relation holds.

$$VC1(\infty)=VC1(0-)-[VC2(\infty)-VC2(0-)] \quad (9)$$

Substituting equations 7 and 8 into the above relation results in the following.

$$VC1(\infty)=2Vres_{i-1}-D_i Vref=Vres_i \quad (10)$$

This is the desired result shown in equation 2. However, the operational amplifier cannot supply infinite current at time t=0 in order to instantaneously change the voltages across capacitors C1 and C2 to reflect: the subtraction of $D_i*Vref$. Instead, during the hold phase 2, the output at time t of the stage is the following.

$$Vres_i(t)=Vres_{i-1}+(1-e^{-\beta t/\tau})(Vres_{i-1}-D_i Vref) \quad (11)$$

In the above equation, $\tau/\beta$ is the time constant of the operational amplifier driving the capacitances divided by the feedback ratio $\beta$. As can be determined from equation 11, the operational amplifier 200 settles on its final output voltage as a decaying exponential with a time constant $\tau/\beta$. Because it is not possible to wait forever until time t=∞ to realize the final output voltage, there must be a some time $t_s$ at which the output $Vres_i(t)$ is deemed to be close enough to its final level $Vres_i(\infty)$. Typically, an analog voltage error equal to one-quarter of a least significant bit is considered to be adequate, since an error at that level will not affect the resulting output code of the pipelined converter. The entire range of analog input is Vref wide. Therefore, the following inequality must hold.

$$1-e^{-\beta t/\tau} \geq 1-\epsilon \quad (12)$$

where $$\epsilon=(1/4)(1/2^N)=1/2^{N+2} \quad (13)$$

In the above equations, $\epsilon$ represents the error fraction corresponding to one quarter of a least significant bit of an N-bit output code. Equations 12 and 13 can be combined and rewritten as the following.

$$e^{-\beta t/\tau} \leq 1/2^{N+2} \quad (14)$$

Taking the natural logarithm of both sides results in the following.

$$\beta t/\tau \leq (N+2)\ln 2 \quad (15)$$

If the minimum time t which meets the above inequality is defined to be the settling time $t_s$ of the operational amplifier, then the following relation holds.

$$t_s=(N+2)(\tau/\beta)\ln 2 \quad (16)$$

If the total period of the clock is T and is equally divided between the sampling phase 1 and the hold phase 2, then the following relation holds.

$$\tau = \frac{(T/2)\beta}{(N+2)\ln 2} \quad (17)$$

By substituting $1/(2\pi f_u)$ for $\tau$, the unity gain bandwidth requirement of the operational amplifier is derived as the following $f_u$.

$$f_u = \frac{(N+2)\ln(2)}{2\pi \beta T/2} \quad (18)$$

The disadvantage, however, of the circuit in FIGS. 2A, 2B, and 2C is that the operational amplifier 200 has to settle to within the required precision of the converter during both the sampling phase 1 and the hold phase 2 of the clock. Assuming an N-bit converter pipelined with a sampling period T, which is equally divided between the sampling and the hold phase of each stage, the required unity gain bandwidth $f_u$ of the operational amplifier can be calculated from equation 18 in which T/2 is the settling time $t_s$, $\beta$ is the feedback gain, and N+2 is the required settling precision within 1/4 of a least significant bit. In this case, $\beta$ is 1/2 because the capacitances of capacitors C1 and C2 are equal, therefore C1/(C1+C2)=1/2.

As a typical example using equation 18, for a 12-bit 40 Megasample per second converter, the required operational amplifier bandwidth $f_u$ is almost 250 MHz. In a practical implementation, the settling time must be even less than T/2 to accommodate for the guard intervals between the non-overlapping phases. Using the same example, the settling time T/2 in a real implementation should be no more than 10 ns, requiring an operational amplifier bandwidth larger than 300 MHz.

Using conventional techniques, the overall clock period is constrained during both the sampling phase and the hold phase by the operational amplifier settling time, which defines the operational amplifier bandwidth. It is therefore desirable to design a pipelined analog to digital converter stage in which the duration of the sampling phase is not constrained by the operational amplifier settling time. Using such a converter stage, it would be desirable to construct a multistage pipelined analog to digital converter that takes advantage of the reduced sampling time requirement so as to have a shorter overall clock period without increasing the operational amplifier bandwidth requirement.

SUMMARY OF THE INVENTION

For a given operational amplifier bandwidth, conventional multistage pipelined analog to digital converters produce a given maximum sampling frequency. One object of the present invention is to increase the sampling frequency of a multistage pipeline analog to digital converter without increasing the bandwidth requirement of the operational amplifier used within each stage. Another object of the present invention is to decrease the bandwidth requirement of the operational amplifier used within each stage without decreasing the sampling frequency of the multistage pipeline analog to digital converter.

According to the present invention, an analog to digital converter stage that has a very short sampling phase settling time requirement is used in a multistage pipelined analog to digital converter with a novel clocking design. Each clock period has a sampling phase and a hold phase. According to a first aspect of the present invention, the sampling phase of each clock cycle is much shorter than the hold phase. This takes advantage of the reduced sampling phase settling time requirement of the analog to digital converter stage according to the present invention, and also allows a relatively longer hold phase during each clock cycle. The analog to digital converter stage according to the present invention is implemented with an operational amplifier such that during the sampling phase, the operational amplifier does not have to settle in order for correct sampling to occur, whereas operational amplifier settling is required during the hold phase.

According to a second aspect of the present invention, several clocks are cyclicly recirculated among the stages of a pipelined analog to digital converter. If M clocks are defined, each clock has a sampling phase which is equal to or less than 1/M times the overall clock period. Every Mth successive pipeline stage runs off the same clock. Thus, if there are M*R pipeline stages in the analog to digital converter, there are R stages running off each clock, and each set of M adjacent stages runs off a different clock. In this manner, the overall clock period can be reduced to $[1+1/(M-1)]\, t_s$, where $t_s$ is the settling time of the operational amplifier, whereas conventional converters require a minimum clock period of $2t_s$.

These and other aspects and advantages of the present invention will be apparent from the Figures as explained in the detailed description of the invention.

DETAILED DESCRIPTION OF THE INVENTION

Figure 3A:
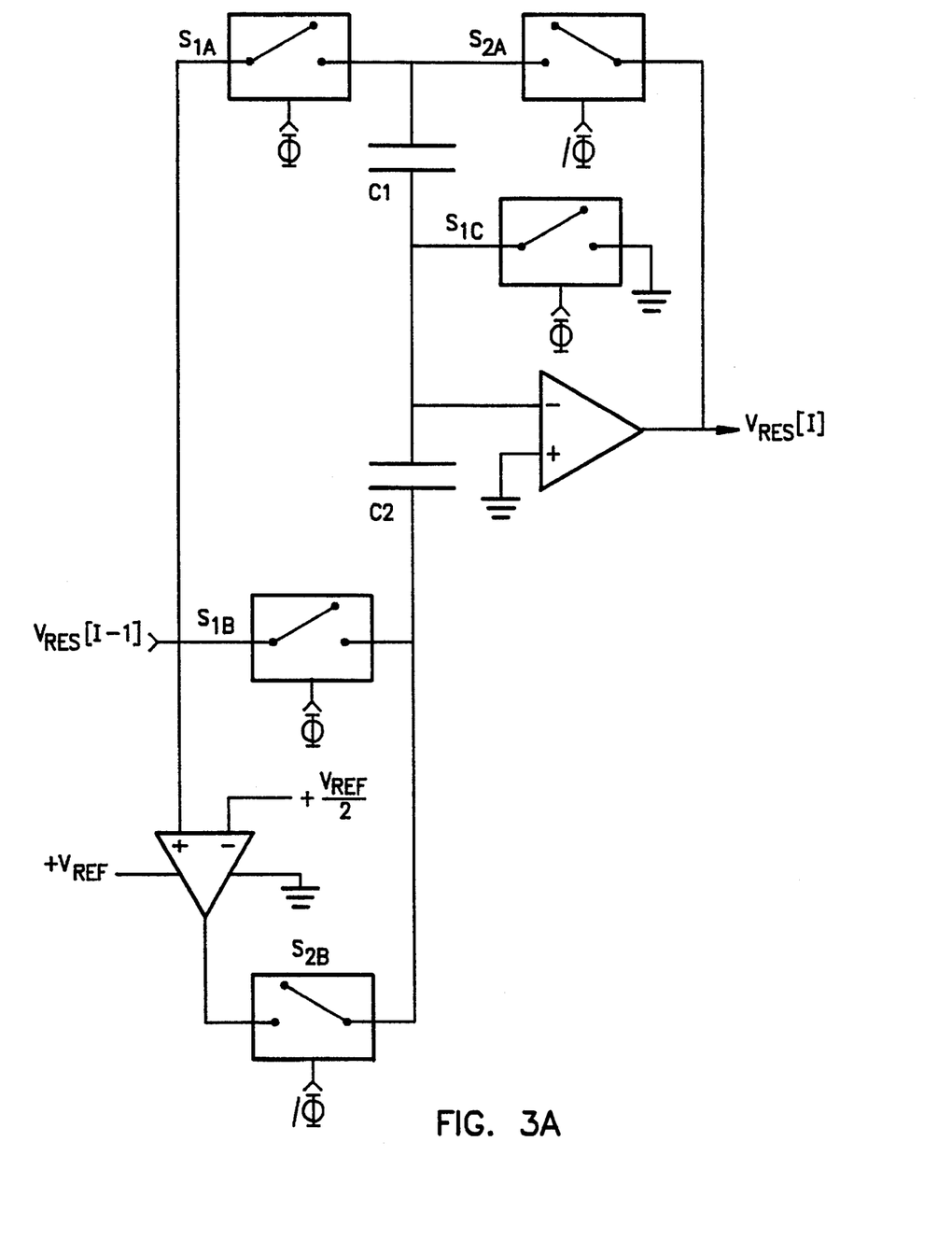
FIG. 3A illustrates a circuit implementation according to the present invention.
Figure 3B:
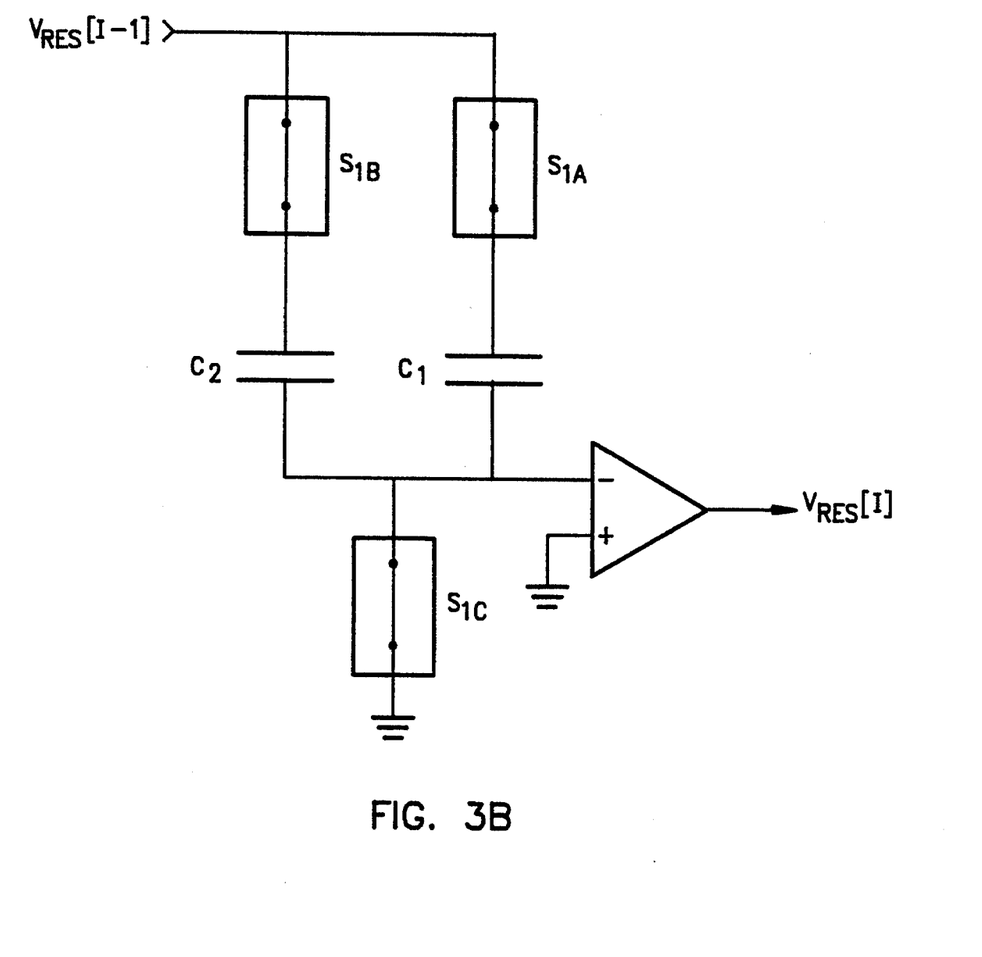
FIG. 3B illustrates the subcircuit created during the sampling phase of the circuit implementation according to the present invention shown in FIG. 3A.

According to a first aspect of the present invention, another implementation of the 1-bit converter stage is shown in FIG. 3A. The difference between the circuit shown in FIG. 3A and that shown in FIG. 2A is that the switch S1C is now connected to ground instead of the operational amplifier output $Vres_i$. Therefore, as shown in FIG. 3B, during phase 1 of the non-overlapping clock, the input is sampled directly on the two capacitors C1 and C2 through the switches S1A, S1B, and S1C. The operational amplifier 300 is not involved in the charging of capacitors C1 and C2. Most importantly, the operational amplifier 300 does not have to settle during the sampling phase 1. Usually, another switch is used to clamp the operational amplifier output, to reduce the output swing in the hold phase 2.

The main disadvantage of the stage design illustrated in FIG. 3A is that the operational amplifier offset contributes an error term (Voffset) in the analog residue $Vres_i$. The final output of the pipeline stage is as follows.

$$Vres_i = 2Vres_{i-1} - D_i Vref + Voffset \qquad (19)$$

This error term is not fundamentally different from other sources of errors in this stage, like the capacitor mismatch, finite operational amplifier gain, and charge injection, for which compensation must be made in a high resolution converter. The effect of the error term introduced into each stage by the operational amplifier offset voltage can be corrected in the analog or digital domain by a variety of converter calibration techniques. The different analog and digital correction and calibration methods are not the subject of the present invention.

Figure 4:
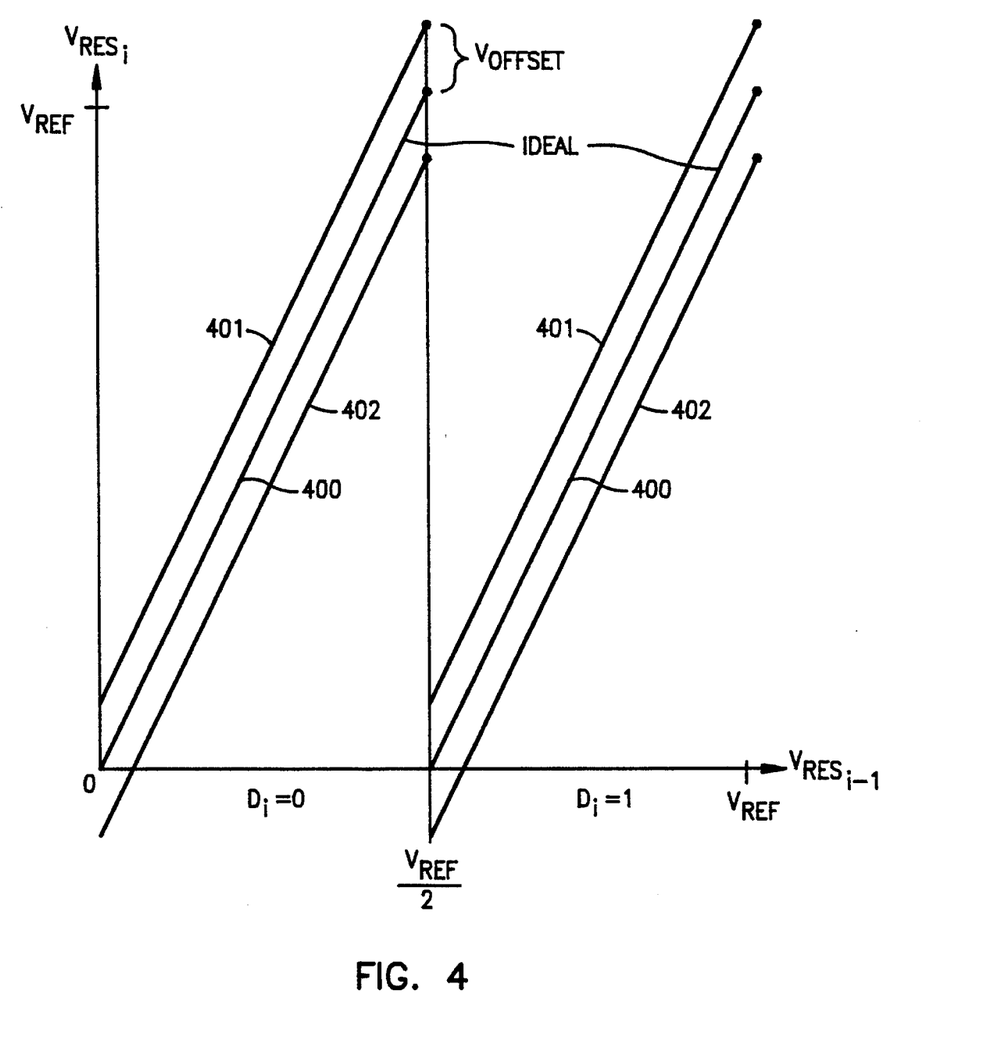
FIG. 4 illustrates the error in the analog residue output as a function of analog input for the circuit implementation according to the present invention shown in FIG. 3A.

FIG. 4 illustrates the effect of this offset error on the resulting residue $Vres_i$. The transfer characteristic 400 illustrates ideal behavior. Transfer characteristics 401 and 402 illustrate the effects of positive and negative operational amplifier offsets, respectively.

The main advantage of the circuit shown in FIG. 3A is that it allows the sampling time to be greatly reduced since the operational amplifier no longer needs to settle. Although the hold time is not affected because the operational amplifier still must settle during the hold time, the sampling time can be made very short. Since the overall clock period is the sampling time plus the hold time, the overall clock period can be reduced to less than $2t_s$ without reducing the hold time below the $t_s$ needed for the operational amplifier to settle. This is especially important for high speed analog to digital converters, because the required operational amplifier bandwidths are at the limit of what a given technology can provide.

The present invention involves the sample and hold timing in a pipeline converter. The main thrust of the present invention is having a hold time much longer than the sampling time for the individual stages in the conversion pipeline. According to the first aspect of the present invention, the sampling phase is shorter than the hold phase. The first aspect provides that the beginning of the present stage's sampling phase occurs some time after the beginning of the previous stage's hold time. Ideally, the sampling phase for the present stage occurs toward the end of the previous stage's hold time, so that the previous stage has its entire hold time during which the amplifier can settle.

Figure 5A:
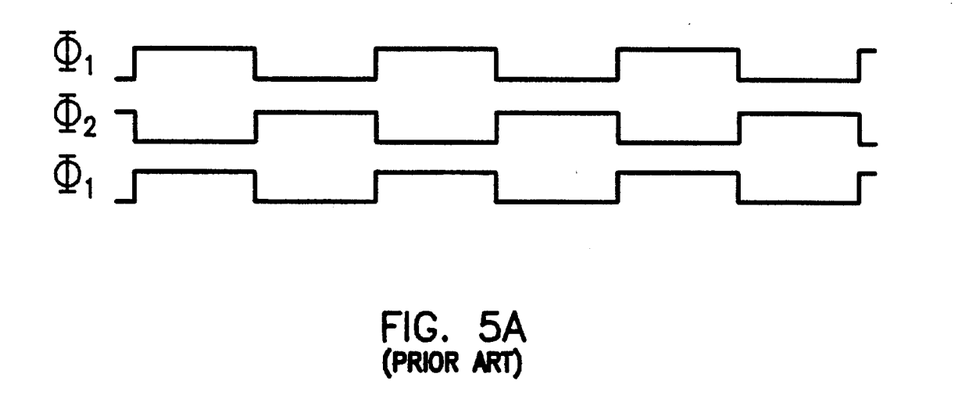
FIG. 5A illustrates the waveforms of a conventional two-phase 50% sampling clock for use in a conventional pipeline analog to digital converter stage as shown in FIG. 2A.
Figure 5B:
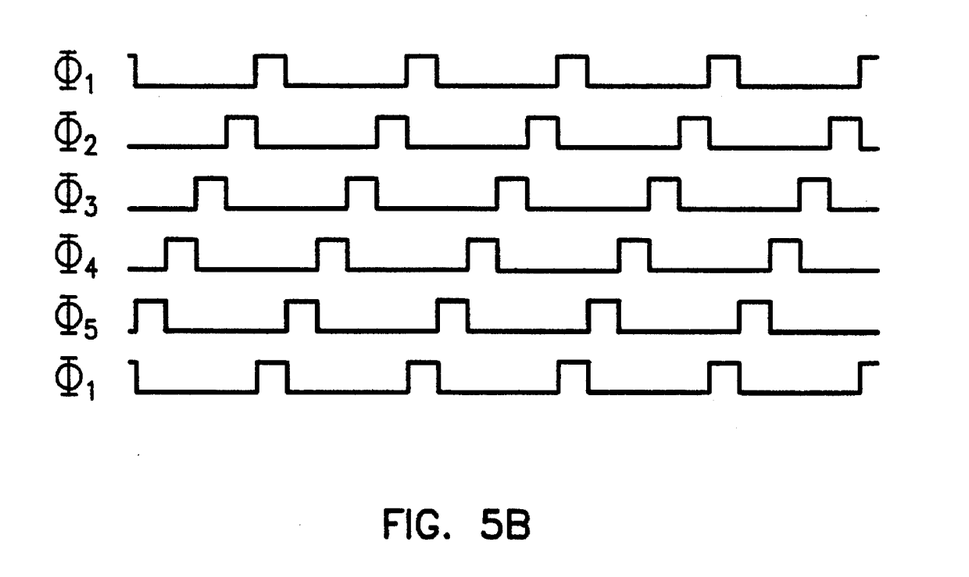
FIG. 5B illustrates the waveforms of a five-phase 20% sampling clock for use in a multistage pipeline analog to digital converter stage according to the present invention as shown in FIG. 3A.

According to a second aspect of the present invention, three or more clocks are cyclicly recirculated among successive analog to digital converter stages. By making the sampling phase a fraction 1/M of the total clock period, there are M unique clocks which are necessary to drive a multi-stage pipelined analog to digital converter having as many stages as is desired. For example, with M clocks, an M*R-stage converter can be constructed such that R stages are driven by each clock, and every Mth stage shares the same clock. This is accomplished with a multi-phase clock, as shown in FIG. 5B. A 5-phase (M=5) sampling clock is used for exemplification. FIG. 5A shows the two phases of clocks used according to the prior art. In the prior art FIG. 5A, the sample time and hold time are equal in duration because they both must be T/2 long to allow the operational amplifier enough time to settle. This is the type of clocking required for a prior art circuit such as that shown in FIG. 2A. In contrast, the clocking pattern shown in FIG. 5B, which is compatible with the circuit shown in FIG. 3A, allows the same duration for the hold time ($t_s$), but allows a shorter duration for the sampling time ($t_s/4$), because the operational amplifier does not have to settle during the sampling time.

The sampling clock of the first stage in the pipeline is chosen to be phase 1. The second stage has the sampling clock phase 2; the third stage has a sampling clock phase 3; the fourth stage has a sampling clock phase 4; and the fifth stage has a sampling clock phase 5. The phases are cyclicly recirculated, such that stage 6 in the pipeline has the sampling clock phase 1. When there are M phases, in general the nth stage has the sampling clock of n modulo M when n is not evenly divisible by the number of phases M; the nth stage has the Mth sampling clock when n is evenly divisible by M. The hold clock for each stage is ideally the inverted sample clock. However, in many applications, non-overlapping sample and hold clocks will be generated so that they are not exact logical inverses of each other. In any case, the hold clocks are illustrated as /Φ1 through /Φ5 in FIGS. 2A and 3A even though they are not necessarily the exact inverses of their Φ1 through Φ5 corresponding clocks. With this clocking strategy, the sample phase of the next subsequent stage in the pipeline always occurs at the end of the hold phase of the present stage. Therefore, the settling time $t_s$ for each stage is extended throughout the entire duration of its hold phase.

With a 5 phase clock, the hold phase can be as long as 80% of the overall converter sampling period T. This is a great improvement over the 50% hold phase for a conventional converter. According to the present invention as illustrated in the clocking example shown in FIG. 5B in which there are five different sampling phases, the required operational amplifier bandwidth is reduced by a factor of 1.6 over a conventional pipeline with the same operational amplifier settling time $t_s$. In general, the required minimum clock period for an M phase pipeline is given by the following equation, where $t_s$ is the settling time of the operational amplifier.

$$T=t_s[1+1/(M-1)] \qquad (20)$$

This is a great improvement over the minimum clock period of $T=2*t_s$ required by conventional pipelines which require operational amplifier settling during the sampling periods. By increasing the number of phases M, the reduction in the required bandwidth over conventional pipelines asymptotically approaches 2 as the required clock period asymptotically approaches $t_s$.

The number of phases M for a given clock period T is however constrained by practical limitations. The minimum sampling period T is constrained by the fact that reasonable switch sizes for S1A and S1B must be used. According to the present invention, although the operational amplifier does not have to settle during the sampling phase as depicted in FIG. 3B, the switches S1A and S1B have non-zero resistances which limit the speed at which capacitors C1 and C2 can be charged or discharged to $Vres_{i-1}$. In a CMOS implementation, the switches are likely to be implemented as transmission gates having P-channel and N-channel transistors. Although the resistances of switches S1A and S1B can be reduced by increasing the widths of the transistors that make up the switches, this increases the size of the cell. More importantly, increasing the sizes of the transmission gates increases the gate capacitances of the transistors. Because the gate capacitances must be driven by the clocks, this increases the load on the clocks, thereby slowing the clocks down and increasing the required size and drive strength of the clock buffers.

Figure 6A:
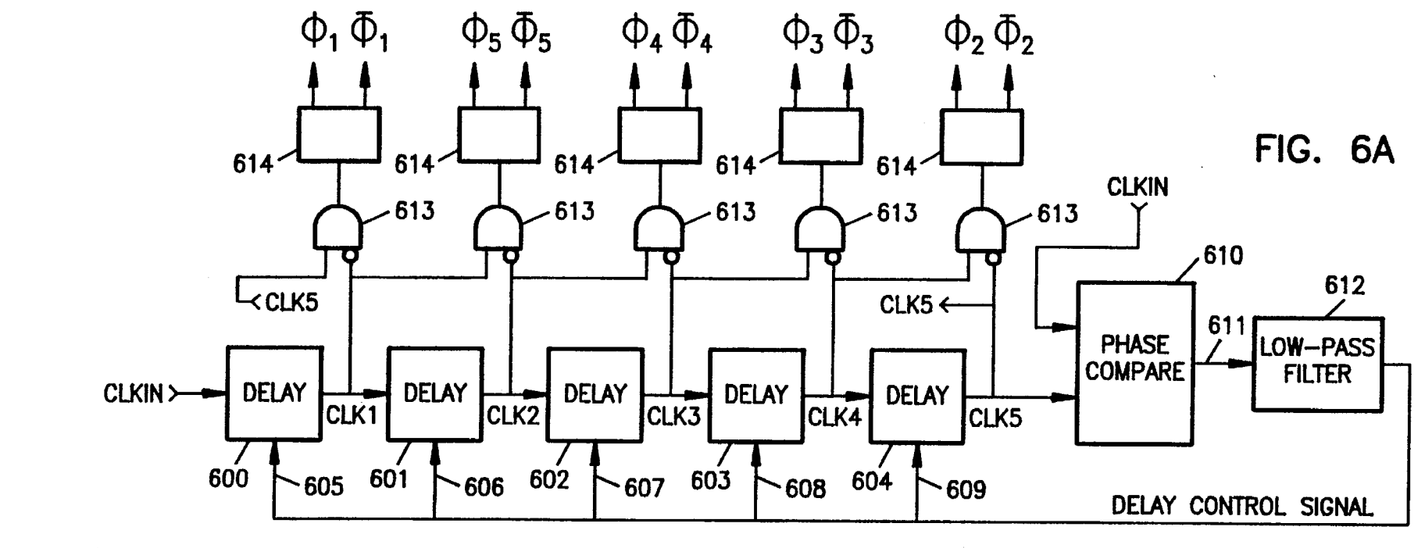
FIG. 6A is a simplified circuit diagram showing a five-phase non-overlapping clock generator suitable for producing the clock waveforms shown in FIG. 5B according to the present invention.

FIG. 6A illustrates one way that a five phase clock generator can be implemented. The clock outputs of the clock generator circuit shown in FIG. 6A (Φ1 through Φ5, and /Φ1 through /Φ5) are consistent with the waveforms illustrated in FIG. 5B. A clock input CLKIN to the clock generator circuit drives a first delay element 600. The delay element 600 produces a delayed clock CLK1 which drives a second delay element 601, which produces another delayed clock CLK2. Similarly, delay elements 602, 603, and 604 produce delayed clocks CLK3, CLK4, and CLK5. Each identical delay element 600, 601, 602, 603, and 604 has a control input 605, 606, 607, 608, and 609, respectively. Each control input allows the adjustment of the delay time $t_D$ for which the delay element's output is delayed relative to its input.

Figure 6B:
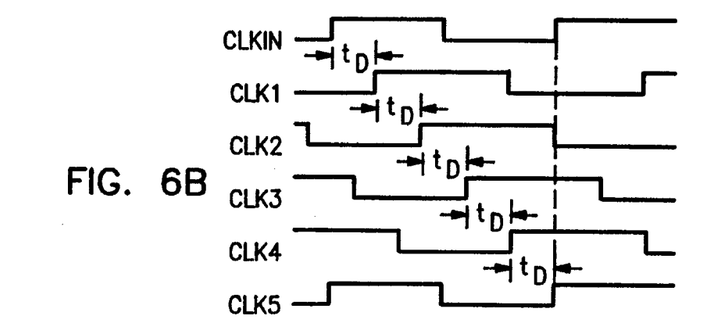
FIG. 6B illustrates the intermediate waveforms generated by the five-phase non-overlapping clock generator shown in FIG. 6A which are used to derive the final clock waveforms such as shown in FIG. 5B according to the present invention.

Because in the circuit of FIG. 6A, each delay element is identical and receives the same delay control input, each successive clock is delayed by $t_D$ from its predecessor clock, as illustrated in FIG. 6B. A phase comparator 610 receives two clock inputs CLKIN and CLK5 and produces an analog phase output 611 that indicates the relative phase of the two clock inputs CLKIN and CLK5. The analog phase output 611 contains higher frequency components which are filtered out by the low-pass filter 612 to produce the delay control signal, which is typically an analog voltage. The delay control signal drives each of the delay elements, which are typically voltage controlled. The configuration shown in FIG. 6A is a typical delay locked loop, in which the delay time $t_D$ is adjusted so that the inputs to the phase comparator (CLKIN and CLK5) have the same phase.

The clocks produced from the delay locked loop, shown in FIG. 6B, are converted into clock pulses as shown in FIG. 5B by logically combining them as performed by logic gates 613. The non-overlapping two phase clock generators and buffers 614 produce non-overlapping clocks which are amplified in drive strength by internal buffers. The clocks ($\Phi 1$ through $\Phi 5$ and $/\Phi 1$ through $/\Phi 5$) are then distributed to the stages of the pipeline.

Another reason why the number of phases M cannot be increased indefinitely is that, as M increases, the complexity of the clock generation becomes prohibitive. If other clock generation techniques are employed, a corresponding increase in complexity is realized by increasing the sampling frequency.

With a five phase sampling clock as shown in FIG. 5B, the operational amplifier bandwidth required for settling to within an analog precision equal to one quarter of a least significant bit is about 200 MHz using the same numerical example as discussed in the background section in which a 12-bit, 40 Megasample per second converter was designed. This estimate was based on a total settling time $t_s$ of 16 nanoseconds, allowing for non-overlapping clock guard intervals and clock jitter.

As computed above, the 300 MHz operational amplifier bandwidth requirement according to conventional techniques represents a 50% greater bandwidth requirement than the 200 MHz bandwidth requirement using the present invention. The alternatives to the present invention have distinct disadvantages. Typically, it is possible to increase the bandwidth of an operational amplifier by increasing its supply current; unfortunately however, this technique has the disadvantage that it increases power dissipation. It is also possible to increase operational amplifier bandwidth by using fabrication processes having smaller feature sizes. However, these processes tend to be more expensive, and there is always a state of the art limitation as to the minimum feature size. For a given feature size and operational amplifier bandwidth, the present invention offers higher sampling frequencies than conventional techniques.

While the present invention has been disclosed with particular reference to an embodiment, that embodiment is presented by way of example, not by way of limitation. Those of ordinary skill in the art will be enabled by this disclosure to add to or modify the embodiment of the present invention in various ways as needed and still be within the scope and spirit of the present invention as recited in the appended claims. Accordingly, various changes and modifications which are obvious to a person skilled in the art to which the invention pertains are deemed to lie within the spirit and scope of the invention as claimed.

What is claimed is:

1. An analog to digital converter stage having an analog residue input and an analog residue output, comprising:

an operational amplifier having a positive op amp input and a negative op amp input and producing the analog residue output, wherein the positive op amp input is connected to ground;

a first capacitor having a first capacitor positive terminal and a first capacitor negative terminal, wherein the first capacitor negative terminal is connected to the negative op amp input;

a second capacitor having a second capacitor positive terminal and a second capacitor negative terminal, wherein the second capacitor negative terminal is connected to the negative op amp input;

a sampling phase first switch that connects the analog residue input to the first capacitor positive terminal during a sampling phase;

a sampling phase second switch that connects the analog residue input to the second capacitor positive terminal during the sampling phase;

a sampling phase third switch that connects the negative op amp input to ground during the sampling phase;

a hold phase first switch that connects the analog residue output to the first capacitor positive terminal during a hold phase; and a hold phase second switch that connects a residue reduction voltage to the second capacitor positive terminal during the hold phase;

wherein the sampling phase is of shorter duration than the hold phase.

2. An analog to digital converter stage as in claim 1, further comprising:

a comparator having a positive comparator input, a negative comparator input, a positive supply input, and a negative supply input and producing the residue reduction voltage.

3. An analog to digital converter stage as in claim 2, wherein the negative supply input is connected to ground, and wherein the positive supply input is connected to a predetermined supply voltage.

4. An analog to digital converter stage as in claim 3, wherein the positive comparator input is connected to the analog residue input, and wherein the negative comparator input is connected to a predetermined comparison voltage.

5. An analog to digital converter stage as in claim 4, wherein the predetermined supply voltage is a reference voltage.

6. An analog to digital converter stage as in claim 5, wherein the predetermined comparison voltage is the reference voltage divided by two.

7. An M-stage pipelined analog to digital converter that takes a converter analog input as input and produces M,K digital output bits, comprising:

a first analog to digital converter stage that takes the converter analog input and a first clock as input and produces a first analog residue output and first K digital output bits;

for each integer i between 2 and M−1, inclusive, an ith analog to digital converter stage that takes the (i−1)th analog residue output as input and an ith clock as input and produces an ith analog residue output and ith K digital output bits; and an Mth analog to digital converter stage that takes the (M−1)th analog residue output as input and an Mth clock as input and produces Mth K digital output bits;

wherein, for each integer i between 1 and M, inclusive, the ith clock includes an ith sampling phase and an ith hold phase, such the ith sampling phase is of shorter duration that the ith hold phase.

8. An M-stage pipelined analog to digital converter as in claim 7, wherein, for each integer i between 2 and M, inclusive, the ith sampling phase begins after the (i−1)th hold phase has begun and ends concurrently with the (i−1)th hold phase.

9. An M*R-stage pipelined analog to digital converter as in claim 8, further comprising:

a clock generator that produces, for i from 1 to M, inclusive, the ith clock.

10. An M-stage pipelined analog to digital converter as in claim 8, wherein K is one.

11. An M-stage pipelined analog to digital converter as in claim 10, wherein, for each integer i between 1 and M, inclusive, the ith clock includes an ith phase 1 clock and an ith phase 2 clock.

12. An M-stage pipelined analog to digital converter as in claim 11, wherein, for each integer i between 1 and M, inclusive, the ith phase 1 clock defines the ith sampling phase such that the ith sampling phase begins when the ith phase 1 clock is asserted and ends when the ith phase 1 clock is deasserted, and the ith phase 2 clock defines the ith hold phase such that the ith hold phase begins when the ith phase 2 clock is asserted and ends when the ith phase 2 clock is deasserted.

13. An M-stage pipelined analog to digital converter as in claim 12, wherein, for each integer i between 1 and M, inclusive, the ith phase 1 clock and the ith phase 2 clock are simultaneously deasserted during an ith first non-overlap period that begins as the ith sampling phase ends and that ends as the ith hold phase begins, and the ith phase 1 clock and the ith phase 2 clock are simultaneously deasserted during an ith second non-overlap period that begins as the ith hold phase ends and that ends as the ith sampling phase begins.

14. An M*R-stage pipelined analog to digital converter that takes a converter analog input as input and produces M*R*K digital output bits, comprising:

a first M-stage pipelined analog to digital converter that takes the converter analog input and, for i from 1 to M, inclusive, an ith clock, as inputs and produces a first Mth analog residue output and first M*K digital output bits;

for each integer j from 2 to R−1, inclusive, a jth M-stage pipelined analog to digital converter that takes the (j−1)th Mth analog residue output and, for i from 1 to M, inclusive, the ith clock, as inputs and produces a jth Mth analog residue output and jth M*K digital output bits; and an Rth M-stage pipelined analog to digital converter that takes the (R−1)th Mth analog residue output and, for i from 1 to M, inclusive, the ith clock, as inputs and produces Rth M*K digital output bits;

wherein, for each integer i from 1 to M, inclusive, the ith clock has an ith sampling phase and an ith hold phase, such that an ith hold phase duration that is at least (M−1) times an ith sample phase duration.

15. An M*R-stage pipelined analog to digital converter as in claim 14, further comprising:

a clock generator that produces, for i from 1 to M, inclusive, the ith clock.

16. An M*R-stage pipelined analog to digital converter as in claim 14, wherein the first M-stage pipelined analog to digital converter comprises:

a first first analog to digital converter stage that takes the converter analog input and the first clock as input and produces a first first analog residue output and first first K digital output bits;

for each integer i between 2 and M−1, inclusive, a first ith analog to digital converter stage that takes the first (i−1)th analog residue output as input and the ith clock as input and produces a first ith analog residue output and first ith K digital output bits; and a first Mth analog to digital converter stage that takes the first (M−1)th analog residue output as input and the Mth clock as input and produces the first Mth analog residue output and first Mth K digital output bits.

17. An M*R-stage pipelined analog to digital converter as in claim 14, wherein, for each integer j from 2 to R−1, inclusive, the jth M-stage pipelined analog to digital converter comprises:

a jth first analog to digital converter stage that takes the first Mth analog residue output as input and the first clock as input and produces a jth first analog residue output and jth first K digital output bits;

for each integer i between 2 and M−1, inclusive, a jth ith analog to digital converter stage that takes the jth (i−1)th analog residue output as input and the ith clock as input and produces a jth ith analog residue output and jth ith K digital output bits; and a jth Mth analog to digital converter stage that takes the jth (M−1)th analog residue output as input and the Mth clock as input and produces the jth Mth analog residue output and jth Mth K digital output bits.

18. An M*R-stage pipelined analog to digital converter as in claim 14, wherein the Rth M-stage pipelined analog to digital converter comprises:

an Rth first analog to digital converter stage that takes the (R−1)th Mth analog residue output as input and the first clock as input and produces an Rth first analog residue output and Rth first K digital output bits;

for each integer i between 2 and M−1, inclusive, an Rth ith analog to digital converter stage that takes the Rth (i−1)th analog residue output as input and the ith clock as input and produces an Rth ith analog residue output and Rth ith K digital output bits; and an Rth Mth analog to digital converter stage that takes the Rth (M−1)th analog residue output as input and the Mth clock as input and produces Mth K digital output bits.

19. An M*R-stage pipelined analog to digital converter as in claim 14, wherein, for each integer i between 2 and M, inclusive, the ith sampling phase begins after the (i−1)th hold phase has begun and ends concurrently with the (i−1)th hold phase.

20. An M*R-stage pipelined analog to digital converter as in claim 14, wherein K is one.

21. An M*R-stage pipelined analog to digital converter as in claim 20, wherein, for each integer i between 1 and M, inclusive, the ith clock includes an ith phase 1 clock and an ith phase 2 clock.

22. An M*R-stage pipelined analog to digital converter as in claim 21, wherein, for each integer i between 1 and M, inclusive, the ith phase 1 clock defines the ith sampling phase such that the ith sampling phase begins when the ith phase 1 clock is asserted and ends when the ith phase 1 clock is deasserted, and the ith phase 2 clock defines the ith hold phase such that the ith hold phase begins when the ith phase 2 clock is asserted and ends when the ith phase 2 clock is deasserted.

23. An M*R-stage pipelined analog to digital converter as in claim 22, wherein, for each integer i between 1 and M, inclusive, the ith phase 1 clock and the ith phase 2 clock are simultaneously deasserted during an ith first non-overlap period that begins as the ith sampling phase ends and that ends as the ith hold phase begins, and the ith phase 1 clock and the ith phase 2 clock are simultaneously deasserted during an ith second non-overlap period that begins as the ith hold phase ends and that ends as the ith sampling phase begins.

\* \* \* \* \*

UNITED STATES PATENT AND TRADEMARK OFFICE
CERTIFICATE OF CORRECTION

PATENT NO. : 5,541,602
DATED : July 30, 1996
INVENTOR(S) : Ion E. Opris, et. al.

It is certified that error appears in the above-indentified patent and that said Letters Patent is hereby corrected as shown below:

Title page, item [54] and col. 1, line 1, delete "PIPELAND" and replace with --PIPELINED--.

Col. 10, line 53, delete "M,K" and replace with --M*K--.

Signed and Sealed this

Nineteenth Day of November, 1996

Attest:

BRUCE LEHMAN

Attesting Officer

Commissioner of Patents and Trademarks